(12) United States Patent
Staples et al.

(10) Patent No.: US 6,336,591 B1
(45) Date of Patent: Jan. 8, 2002

(54) SIGNALLING BETWEEN INDEPENDENTLY POWERED ELECTRICAL CIRCUIT CARDS

(75) Inventors: Edward M. Staples, St. Albans; Gareth E. Allwright, Maulden, both of (GB)

(73) Assignee: 3Com Technologies, Georgetown (KY)

( * ) Notice: Subject to any disclaimer, the term of this patent is extended or adjusted under 35 U.S.C. 154(b) by 0 days.

(21) Appl. No.: 09/184,283

(22) Filed: Nov. 2, 1998

(30) Foreign Application Priority Data

Dec. 16, 1997 (GB) ................................ 9726513

(51) Int. Cl.$^7$ .............................................. G06K 19/00
(52) U.S. Cl. .................................. 235/487; 235/380
(58) Field of Search ....................... 235/380; 307/125, 307/130, 131

(56) References Cited

U.S. PATENT DOCUMENTS

| | | | | | |
|---|---|---|---|---|---|
| 5,454,080 A | * | 9/1995 | Fasig et al. | .................. | 395/275 |
| 5,491,827 A | * | 2/1996 | Holtey | ................... | 395/800 |
| 5,546,017 A | * | 8/1996 | Vitunic | .................. | 326/30 |
| 5,568,610 A | * | 10/1996 | Brown | ................. | 395/185.01 |
| 5,574,865 A | * | 11/1996 | Hashemi | .................... | 395/283 |
| 5,589,719 A | * | 12/1996 | Fiset | ........................ | 307/131 |
| 5,726,506 A | * | 3/1998 | Wood | ......................... | 307/147 |
| 5,754,797 A | * | 5/1998 | Takahashi | ................... | 395/283 |
| 5,862,350 A | * | 1/1999 | Coulson | ..................... | 395/283 |
| 5,875,307 A | * | 2/1999 | Ma et al. | .................... | 395/281 |
| H1801 H | * | 9/1999 | Browning et al. | ............. | 379/9 |
| 5,996,035 A | * | 11/1999 | Allen et al. | .................. | 710/103 |
| 6,026,456 A | * | 2/2000 | IIkbahar | .................... | 710/101 |
| 6,026,458 A | * | 2/2000 | Rasums | ....................... | 710/103 |

FOREIGN PATENT DOCUMENTS

| | | | | | |
|---|---|---|---|---|---|
| EP | 0351961 | * | 1/1990 | .......... | G06F/13/40 |
| EP | 0529142 | * | 1/1990 | .......... | G06F/13/40 |
| EP | 0574991 | * | 1/1990 | .......... | G06F/13/40 |
| EP | 0613076 | * | 1/1990 | .... | G06F/1/22 .... |

* cited by examiner

Primary Examiner—Karl D. Frech
(74) Attorney, Agent, or Firm—Nixon & Vanderhye P.C.

(57) ABSTRACT

A plurality of circuit cards include at least a first card having a first internal power rail, an earth connection, respective operating circuits powered from the first power rail, external terminals coupled to its operating circuit, and a first external connection. A second of the plural cards has a second internal power rail, an earth connection, respective operating circuits powered from the second power rail, external terminals coupled to its operating circuit, and a second external connector. The first card includes a bipolar transistor with an emitter-base junction forwardly biased in response to normal voltage between the first power rail and the earth connection and a collector connected to the first external connector. The second card includes a resistive connection between its second internal power rail and the second external connector and circuits responsive to changes in voltage level at the second connector.

11 Claims, 2 Drawing Sheets

SIGNALLING BETWEEN INDEPENDENTLY POWERED ELECTRICAL CIRCUIT CARDS

FIELD OF THE INVENTION

This invention relates to signaling between electrical circuit cards which are independently powered. The term electrical circuit cards' is meant electrical and electronic circuits mounted on rigid or semi-rid carriers so that they may be stacked or otherwise removably disposed in a suitable chassis. Such cards may be used for building or extending electrical or signal processing systems.

BACKGROUND TO THE INVENTION

The present invention is particularly intended for use in circuit or network cards in communication systems, but is not necessarily limited thereto, the nature of the operating circuits oil the cards, the physical configuration of the cards and the nature and method of the connections being generally unimportant for the realization of the present invention.

An important facility which cards of this nature should have is a means enabling, one card to determine whether the power supply of another card is properly active. Various sophisticated recognition systems are known for example from EP-0552873-A1, EP-0351961-A2 and IBM Technical Disclosure Bulletin Vol. 29, No. 3, August 1986, pages 1060–1062.

The present invention concerns a simple, reliable and low cost means of enabling one card to monitor the status of the voltage supply of another card.

SUMMARY OF THE INVENTION

The present invention is based on the provision of a bipolar transistor which is coupled directly or indirectly to the internal voltage supply rail of a first card and to a common earth connection such that its emitter/base junction is forward biased when the first voltage rail is properly powered. The collector of this transistor is connected to an external terminal which is adapted to connection to a terminal on a second card, wherein the respective internal voltage supply rail is connected by way of a pull-up resistor to the respective connector, whereby a voltage level which is either close to that of the common earth connection or close to that of the internal voltage supply rail of the second card indicates whether the voltage supply of the first card is properly active. The biasing of the transistor in the first card may be by way of a circuit directly connected between the first voltage supply rail and the common earth connection. Alternatively, the voltage at this rail may be monitored so as to control a switching stage which itself forward or reverse biases the base emitter junction of the transistor according, to its switching state. More particularly, the switching stage may be enabled by software control, preferably by way of a microprocessor, and in accordance with the voltage level at the first voltage rail to alter the bias voltage for the base emitter junction of the said transistor.

DETAILED DESCRIPTION

Figure 1:
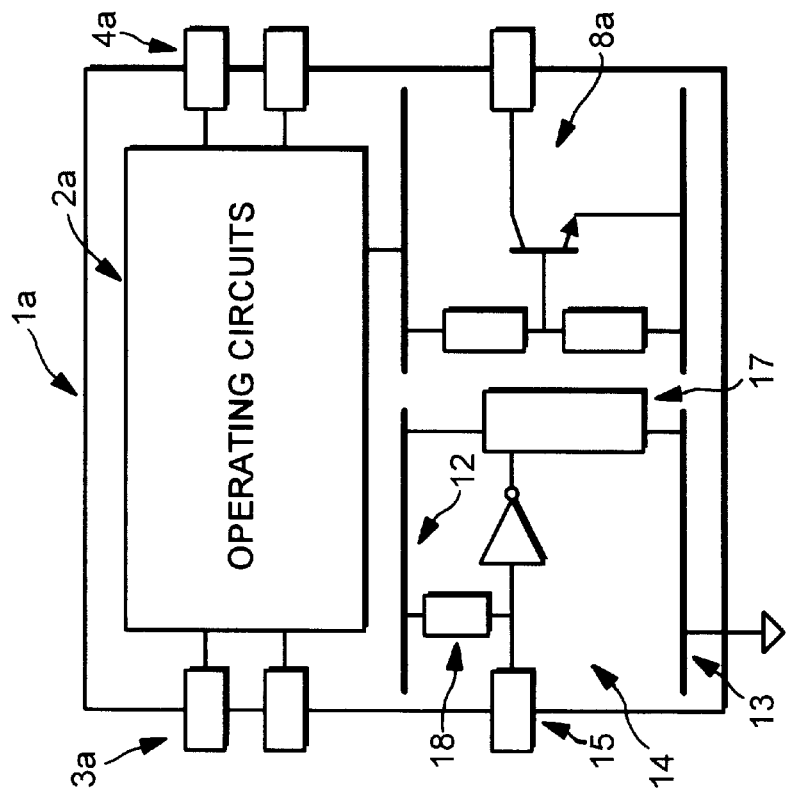
FIG. 1 illustrates two circuit cards embodying the invention.
Figure 1:
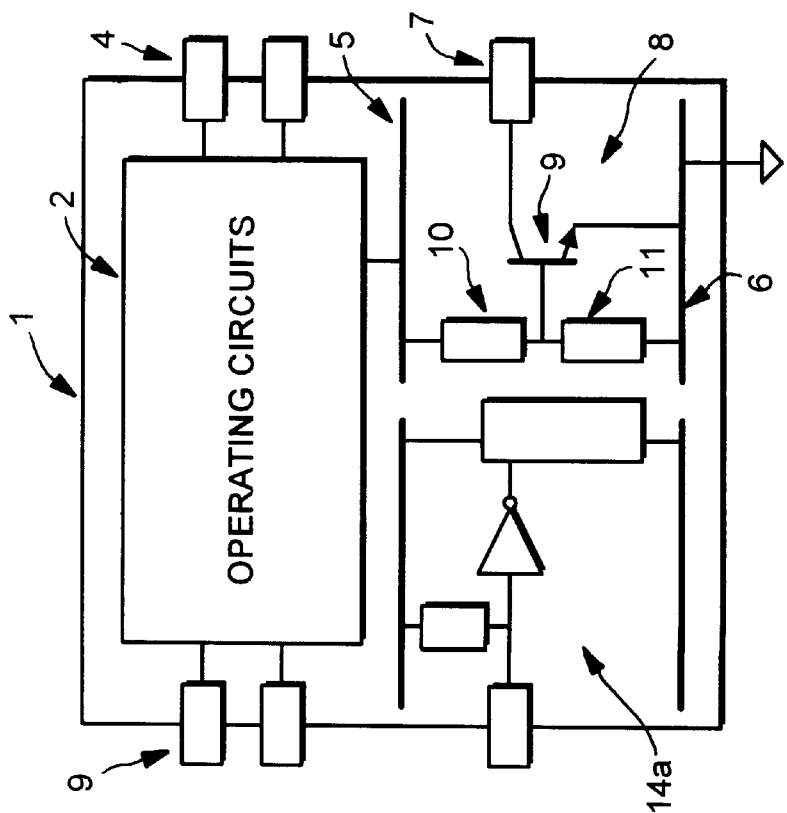

In FIG. 1 is shown a first circuit card 1 including operating circuits 2 of which the particular manner of operation is not relevant to the present invention. The circuits 2 extend to terminal connections 3 and 4. Circuits 2 are powered from an internal voltage supply rail 5 and are also connected, by means not shown, to an earth connection 6.

The card 1 has a further terminal connection 7 which is used for signaling, when the card 1 is connected to a second card 1a, the status of the voltage supply at rail 5. The particular form of the card 1 and the connectors 3, 4 and 7 is not important to the present invention. The terminal connector 7 may be part of a standardized multi-pin or multi-socket port including, for example, the connectors 4.

In this embodiment part of the signaling system is constituted by a bipolar transistor 9 on the first card. The collector of this transistor is connected, in this example directly, to connector 7, the emitter is connected, in this example directly, to the earth rail 6 and the base is connected to the junction between biasing resistors 10 and 11 in series between the rail 5 and the rail 6. The biasing is arranged so that when the supply voltage 5 is normal, the base emitter junction of transistor 9 is forward biased so that there is conduction through the collector/emitter path of transistor 9 if collector 9 is connected appropriately to a supply voltage.

The second card 1a has operating circuits 2a, terminals 3a and 4a generally similar to the corresponding parts of card 1. The circuits 2a may perform any desired function, either in cooperation with the circuits 2 or otherwise.

The second card 1a has an internal voltage supply rail 12, an earth rail 13, which constitutes a common earth connection with rail 6. Card 1a includes a terminal connector 15 which is adapted for connection with terminal connector 7 on card 1. The rail 12 is connected by way of resistor 18, constituting a 'pull-up' resistor to terminal 15 and also to the input of a buffer 16 which may be constituted by an inverter. The output of buffer 16 drives a circuit 17 which may process in any convenient manner the indication which the signalling system provides.

Thus the signalling system constitutes two parts, a part 8 on card 1 and constituted by the transistor 9 and the ancillary components, and a second part 14, on card 1a, constituted by resistor 18, connector 15 and any ancillary components.

If the two cards are normally powered, and connector 7 is connected to connector 15, transistor 9 conducts, the current flow through the connector/emitter path flowing through resistor 18 from the (second) voltage rail in card 1a. Thus the voltage level at the junction between connector 15 and resistor 18 will be 'low' and close to that of the earth rails 6 and 13; the voltage drop across resistor 18 should be much greater than the voltage drop across transistor 9. However, if the voltage supply at rail 5 fails or is powered down, transistor 9 is cut off, so that the voltage drop across it is very much greater than the voltage drop across resistor 18: the voltage level at the junction of connector 15 and resistor 18 approaches that of voltage rail 12.

The voltage levels provided by the signalling system are buffered by buffer amplifier 16 and, as mentioned previously, converted into any suitable form for signalling or control by means of circuit 17.

FIG. 1 also shows a modification wherein the first card 1 monitors the status of the voltage rail 12 in the card 1a. For this purpose circuit 8a on card 1a, and similar to circuit 8 on card 1, is connected to a circuit 14a disposed on card 1 and resembling circuit 14 on card 1a. If Such mutual monitoring is provided, the net current flow in the earth connection may be zero.

Figure 2:
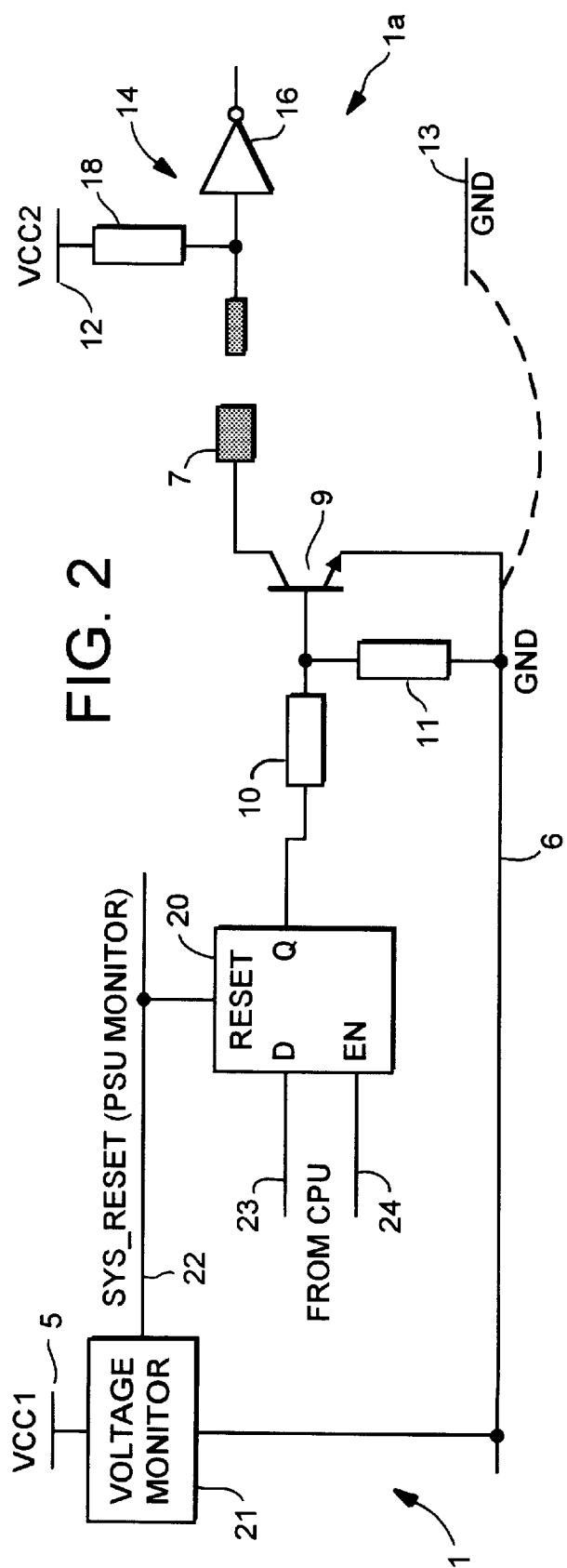
FIG. 2 illustrates a modification of the embodiment shown in FIG. 1.

FIG. 2 illustrates a further modification wherein the transistor 9 is indirectly controlled by the status of supply rail 5. In this form of the invention, the biasing of transistor 9 is not directly from the rail 5 but from the Q output of a bistable switching stage 20. In particular, the voltage at rail 5 is monitored by a monitor 21 which provides a reset signal on a line 22 if the voltage falls below some predetermined value, the consequent change in the Q output from 1 to 0 serving to cut-off transistor 9. The bistable switching stage may be a D-type bistable which has D and enable inputs controlled by a central processing unit so that when the power supply to the rail 5 is restored, the output Q changes from 0 to 1 when the central processor determines to enable signaling by way of transistor 9. Otherwise, the circuit operates as previously described, the Q output being used to bias the base of transistor 9 by means of the resistors 10 and 11 and the circuit 14 on card 1a being the same as described with reference to FIG. 1.

We claim:

1. A plurality of circuit cards including:
   at least a first card having a first internal power rail, an earth connection, respective operating circuits powered from said first internal power rail, and external terminals coupled to said operating circuit, and a first external connector;
   and a second card having a second internal power rail, an earth connection, respective operating circuits powered from said second internal power rail, external terminals coupled to said operating circuit, and a second external connector;
   wherein said first card includes a bipolar transistor having an emitter-base junction forwardly biased in response to normal voltage between said first internal power rail and said earth connection and a collector connected to said first external connector;
   and said second card includes a resistive connection between said second internal power rail and said second external connector and means responsive to changes in voltage level at said second connector.

2. A plurality of circuit cards according to claim 1 wherein said first card includes a biasing network for said transistor, the biasing network being connected between said first internal power rail and the earth connection.

3. A plurality of circuit cards according to claim 1 wherein said first card includes a biasing network which is controlled by the output of a switching stage responsive to a signal indicating the status of the first internal power rail.

4. A plurality of circuit cards including:
   a first card having a first internal power rail, an earth connection, respective operating circuits powered from said first internal power rail, external terminals coupled to said operating circuit, and a first external connector; and
   a second card having a second internal power rail, an earth connection, respective operating circuits powered from said second internal power rail, external the output of a switching stage responsive to a signal indicating the status of the first internal power rail.

5. A plurality of circuit cards as in claim 4 wherein said first card includes a biasing network for said emitter-base junction of said transistor, the biasing network being connected between said first power rail and the earth connection.

6. A plurality of circuit cards as in claim 4 wherein said first card includes a biasing network for said emitter-base junction which is controlled by the output of a switching stage responsive to a signal indicating the status of the first power rail.

7. A circuit for inter-card monitoring of independently powered voltage supply rails in a plurality of circuit cards, said circuit comprising:
   (a) a bipolar transistor disposed on a monitored first card, said transistor having a base-emitter junction biased to reflect the state of a voltage supply rail of said first card and a collector connected to an externally accessible connector;
   (b) a collector pull-up resistor disposed on a monitoring second card and connected between a voltage supply rail of said second card and to an externally accessible connector adapted for connection to the external connector of the first card; and
   (c) a voltage responsive circuit on said second card connected to said pull-up resistor for sensing the supply voltage status of the voltage supply rail of the first card.

8. A circuit as in claim 7 wherein each of a plurality of cards include:
   structure (a) for connection to structures (b) and (c) of another one of said plural cards; and
   structures (b) and (c) for connection to structure (a) of another one of said plural cards.

9. A circuit as in claim 7 wherein said first card includes a biasing network which is controlled by the output of a switching stage responsive to a signal indicating the status of the voltage supply rail of said first card.

10. A plurality of circuit cards adapted for interconnection with each other and comprising:
    a first circuit card having a first internal power rail powering first operating circuits thereon;
    a second circuit card having a second internal power rail powering second operating circuits thereon;
    a bipolar transistor disposed on said first circuit card;
    said transistor having a base-emitter bias circuit powered directly or indirectly from said first internal power rail and a collector-emitter circuit powered from said second internal power rail; and
    a voltage responsive circuit coupled to said collector-emitter circuit and disposed on said second circuit card to thereby monitor the status of said first internal power rail on said first circuit card.

11. A plurality of circuit cards as in claim 10 further comprising:
    a further bipolar transistor disposed on said second circuit card;
    said further transistor having a base-emitter bias circuit powered directly or indirectly from said second internal power rail and a collector-emitter circuit powered from said first internal power rail; and
    a further voltage responsive circuit coupled to said collector-emitter circuit of said further transistor and disposed on said first circuit card to thereby monitor the status of said second internal power rail on said second circuit card.

* * * * *

UNITED STATES PATENT AND TRADEMARK OFFICE
CERTIFICATE OF CORRECTION

PATENT NO. : 6,336,591 B1  
DATED : January 8, 2002  
INVENTOR(S) : Staples et al.

It is certified that error appears in the above-identified patent and that said Letters Patent is hereby corrected as shown below:

Column 1,  
Line 8, change "semi-rid" to -- semi-rigid --; and  
Line 18, change "oil" to -- on --.

Signed and Sealed this

Twenty-seventh Day of August, 2002

*Attest:*

JAMES E. ROGAN  
*Attesting Officer*   *Director of the United States Patent and Trademark Office*